US012585181B2

(12) United States Patent
    Bae et al.

(10) Patent No.: US 12,585,181 B2
(45) Date of Patent: Mar. 24, 2026

(54) METHOD OF FABRICATING MASK AND METHOD OF FABRICATING SEMICONDUCTOR DEVICE USING THE MASK

(71) Applicant: Samsung Electronics Co., Ltd., Suwon-si (KR)

(72) Inventors: Sung-Hwan Bae, Seoul (KR); Se Jin Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 691 days.

(21) Appl. No.: 18/052,026

(22) Filed: Nov. 2, 2022

(65) Prior Publication Data

US 2023/0288795 A1     Sep. 14, 2023

(30) Foreign Application Priority Data

Nov. 5, 2021     (KR) ......................... 10-2021-0151006

(51) Int. Cl.
    *G03F 1/36*     (2012.01)
    *G03F 1/44*     (2012.01)
    *G03F 1/70*     (2012.01)
    *G03F 7/00*     (2006.01)

(52) U.S. Cl.
    CPC ................. *G03F 1/36* (2013.01); *G03F 1/44* (2013.01); *G03F 1/70* (2013.01); *G03F 7/70525* (2013.01)

(58) Field of Classification Search
    CPC ..... G03F 1/36; G03F 1/44; G03F 1/70; G03F 7/70525
    See application file for complete search history.

(56) References Cited

U.S. PATENT DOCUMENTS

| | | | |
|---|---|---|---|
| 7,349,066 B2 | 3/2008 | Eurlings et al. | |
| 8,103,977 B2 | 1/2012 | Taoka et al. | |
| 10,031,410 B2 | 7/2018 | Shin et al. | |
| 2005/0022150 A1 | 1/2005 | Liu et al. | |
| 2008/0193863 A1 | 8/2008 | Shin et al. | |
| 2020/0081352 A1 | 3/2020 | Kim | |
| 2021/0063868 A1* | 3/2021 | Bang ......................... | G03F 1/70 |
| 2022/0057707 A1* | 2/2022 | Kim .................. | H01L 21/28518 |
| 2023/0185183 A1* | 6/2023 | Hu ...................... | G03F 7/70441 |
| | | | 430/5 |

FOREIGN PATENT DOCUMENTS

| | | |
|---|---|---|
| KR | 2011/0001133 A | 1/2011 |
| KR | 2011/0001145 A | 1/2011 |

OTHER PUBLICATIONS

Office Action in Korean Appln. No. 10-2021-0151006, mailed on Sep. 17, 2025, 11 pages (with English translation).

* cited by examiner

*Primary Examiner* — Nghia M Doan
(74) *Attorney, Agent, or Firm* — Fish & Richardson P.C.

(57) ABSTRACT

A method of fabricating a mask by performing optical proximity correction (OPC) is provided. The method of fabricating a mask includes generating a target curve by using bias control points, extracting a first contour of an initial design mask by performing an OPC process, generating a first updated design mask, which is obtained by updating the initial design mask, by using the first contour and the target curve, extracting a second contour of the first updated design mask by performing the OPC process, and generating a second updated design mask by using the second contour and the target curve.

20 Claims, 23 Drawing Sheets

METHOD OF FABRICATING MASK AND METHOD OF FABRICATING SEMICONDUCTOR DEVICE USING THE MASK

CROSS-REFERENCE TO RELATED APPLICATION

This application claims priority from Korean Patent Application No. 10-2021-0151006 filed on Nov. 5, 2021 in the Korean Intellectual Property Office, and all the benefits accruing therefrom under 35 U.S.C. 119, the contents of which in its entirety are herein incorporated by reference.

BACKGROUND

1. Field

The present disclosure relates to methods of fabricating a mask and methods of fabricating a semiconductor device using the mask.

2. Description of the Related Art

Various types of electronic devices are being used. An electronic device may perform its own function according to operations of various kinds of chips or circuits that may be included therein. The chips or circuits of the electronic device may be implemented with semiconductor elements that may be fabricated by a semiconductor process.

Specifically, the chips or circuits may be obtained by a photolithography process. The photolithography process is used to print a layout on a semiconductor wafer (e.g., a silicon or gallium arsenide (GaAs) wafer). The layout on the semiconductor wafer includes circuit patterns, and the circuit patterns are designed to perform particular functions.

During the photolithography process, a mask may be used to print the layout on the semiconductor wafer. The mask may include transparent areas and opaque areas. The transparent areas are formed by etching a metal layer and transmit light therethrough. On the contrary, the opaque areas do not transmit light therethrough. The transparent areas and the opaque areas form image patterns for use in printing the layout on the semiconductor wafer. Light emitted from a light source is applied onto the semiconductor wafer through the image patterns of the mask. As a result, a layout including the circuit patterns is printed on the semiconductor wafer.

However, as the integration density of semiconductor processes has increased, the distance between the image patterns of each mask and the width of the transparent areas of each mask have considerably decreased. Due to the proximity of the image patterns of each mask to one another, the interference and diffraction of light are highly likely to occur, and a different layout from the desired layout may be printed on the semiconductor wafer.

To prevent or reduce the distortion of a layout, resolution enhancement technology such as an optical proximity correction (OPC) method may be used. According to the OPC method, the degree of distortion such as the interference and diffraction of light can be estimated in advance. Also, image patterns to be formed in a mask can be biased in advance based on the result of the estimation. Accordingly, a desired layout can be printed on a wafer.

SUMMARY

Aspects of the present disclosure provide methods of fabricating a mask by performing optical proximity correction (OPC).

Aspects of the present disclosure also provide methods of fabricating a semiconductor device using a mask obtained by OPC.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a method of fabricating a mask, comprising generating a target curve by using bias control points, extracting a first contour of an initial design mask by performing an optical proximity correction (OPC) process, generating a first updated design mask, based on updating the initial design mask using the first contour and the target curve, extracting a second contour of the first updated design mask by performing the OPC process, and generating a second updated design mask by using the second contour and the target curve.

According to another aspect of the present disclosure, there is provided a method of fabricating a mask, comprising generating an initial target curve, generating a plurality of bias control points on the initial target curve, generating a target curve by using the bias control points, extracting a first contour of an initial design mask by performing an optical proximity correction (OPC) process after the generating the target curve, generating a first updated design mask based on updating the initial design mask using the first contour and the target curve, and generating a final design mask by repeatedly performing the OPC process.

According to still another aspect of the present disclosure, there is provided a method of fabricating a semiconductor device, comprising fabricating a mask, and forming patterns on a substrate by using the mask, wherein the fabricating the mask includes generating an initial target pattern, generating an initial target curve that meets the initial target pattern, generating bias control points on the initial target curve, generating a target curve by using the bias control points, extracting a first contour of an initial design mask by performing an optical proximity correction (OPC) process after the generating the target curve, generating a first updated design mask based on updating the initial design mask using the first contour and the target curve, extracting a second contour of the first updated design mask by performing the OPC process, and generating a second updated design mask by using the second contour and the target curve.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIGS. 2 through 11 illustrate the method of generating a target curve according to some example embodiments of the present disclosure;

Figure 13:
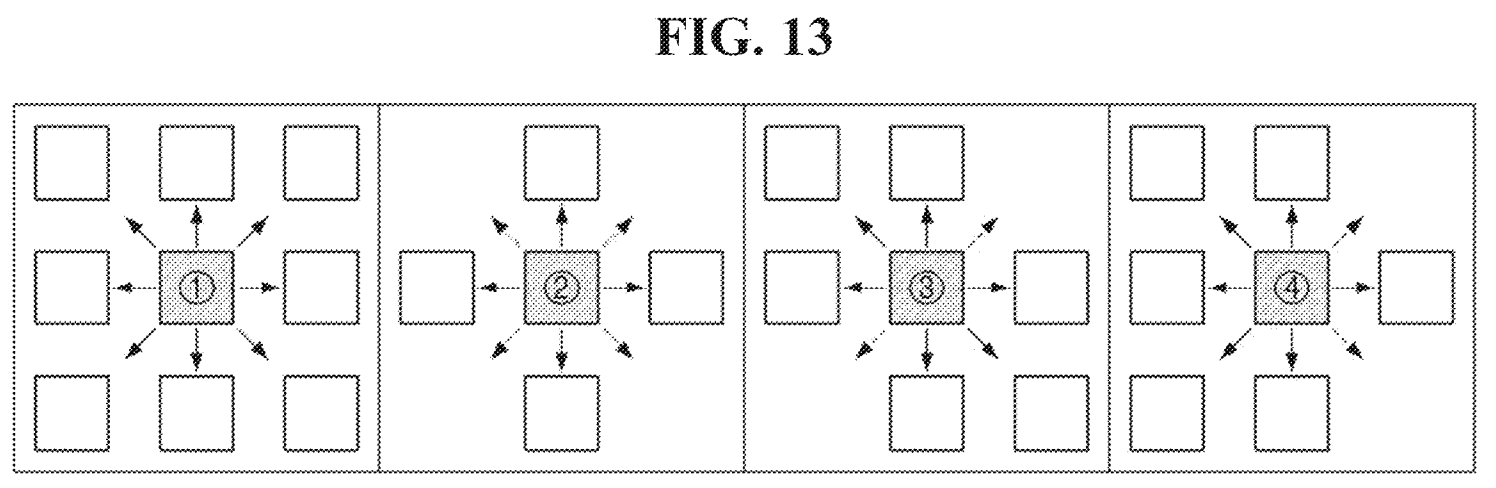

FIGS. 12 and 13 illustrate the benefits of the method of generating a target curve according to some example embodiments of the present disclosure;

FIGS. 15 through 18 illustrate the method of fabricating a mask according to some example embodiments of the present disclosure;

DETAILED DESCRIPTION

Figure 1:
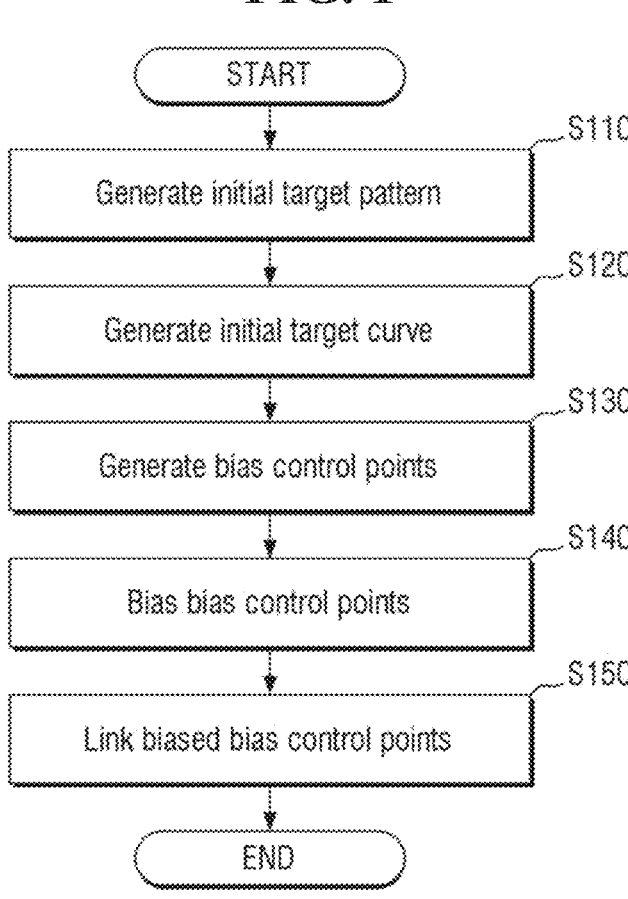
FIG. 1 is a flowchart illustrating a method of generating a target curve according to some example embodiments of the present disclosure.

Example embodiments of the present disclosure will hereinafter be described with reference to the attached drawings, Like reference numerals indicate like elements throughout the present disclosure, and thus, detailed descriptions thereof will be omitted.

FIG. 1 is a flowchart illustrating a method of generating a target curve according to some example embodiments of the present disclosure. FIGS. 2 through 11 illustrate the method of generating a target curve according to some example embodiments of the present disclosure. FIGS. 12 and 13 illustrate the benefits of the method of generating a target curve according to some example embodiments of the present disclosure.

Referring to FIGS. 1 through 11, the method of generating a target curve according to some example embodiments of the present disclosure may be used to perform optical proximity correction (OPC) during the design and fabrication of a semiconductor device. OPC is a technique of compensating for any errors and distortions such as diffraction or process effects that may occur due to the characteristics of light during an exposure process using patterns of a design layout.

Figure 2:
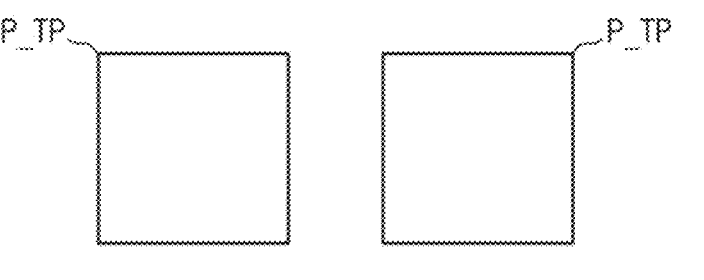
Figure 2:
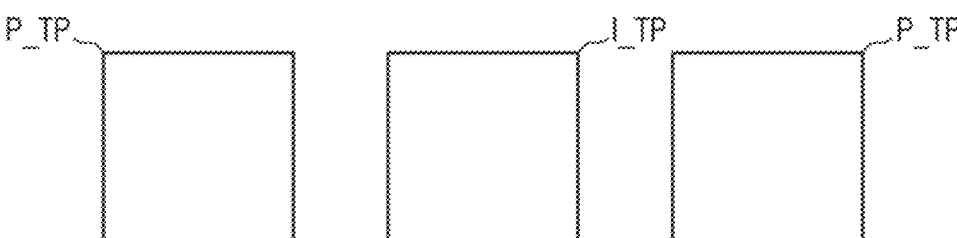
Figure 2:
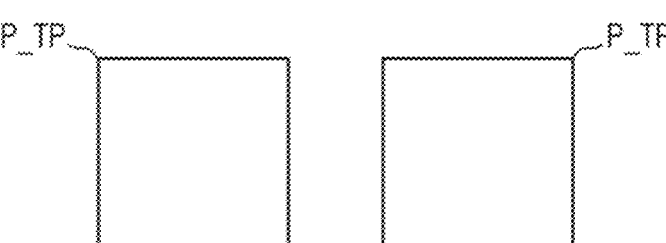
Figure 3:
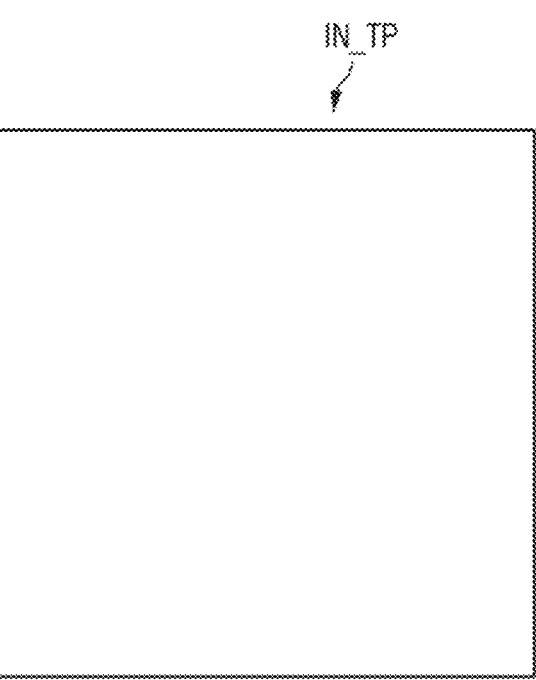
Figure 4:
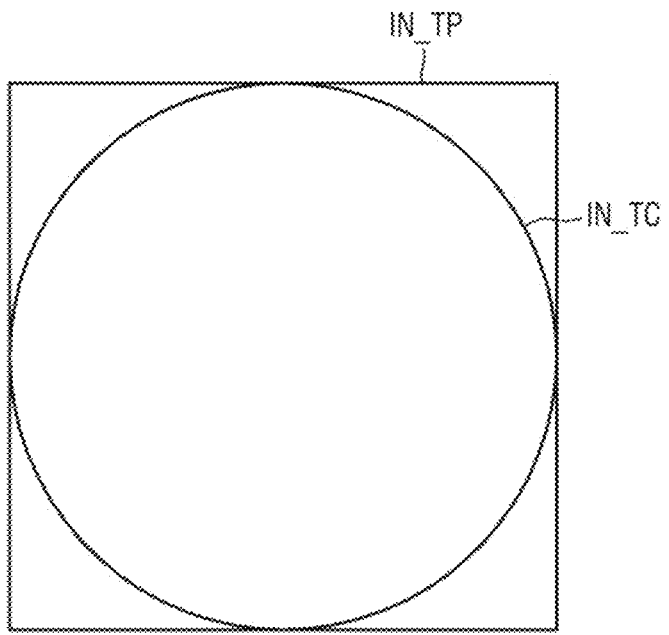

Referring to FIGS. 1 through 3, an initial target pattern IN_TP is generated (S110). The initial target pattern IN_TP may include a plurality of circuit patterns, layout patterns, and/or a polygon included in a design layout. For example; the initial target pattern IN_TP may be a polygon having n sides. Here, n may be a natural number of 4 or greater.

Referring to FIG. 2 the design layout may include an interest target pattern I_TP and peripheral target patterns P_TP. The peripheral target patterns P_TP may be patterns around the interest, target pattern I_TP, The initial target pattern IN_TP may be associated with the interest target pattern I_TP.

For example, the initial target pattern IN_TP may have the same shape as the interest target pattern I_TP. In another example, the initial target pattern IN_TP may have the same shape as the interest, target pattern I_TP in appearance, The initial target pattern IN_TP may be obtained by changing the size of the interest target pattern I_TP. The initial target pattern IN_TP may be obtained by increasing or reducing the size of the interest target errs I_TP.

Referring to FIGS. 1 and 4 through 5B, an initial target curve IN_TC is generated (S120).

The initial target curve IN_TC meets the initial target pattern IN_TP. The initial target curve IN_TC may be generated to meet the initial target pattern IN_TP. The initial target curve IN_TC may meet each of the sides of the initial target patterns IN_TP.

For example, in a case where the initial target pattern IN_TP is a polygon having n sides, the initial target curve IN_TC may meet each of then sides of the initial target pattern IN_TP.

Figures 5A, 5B:
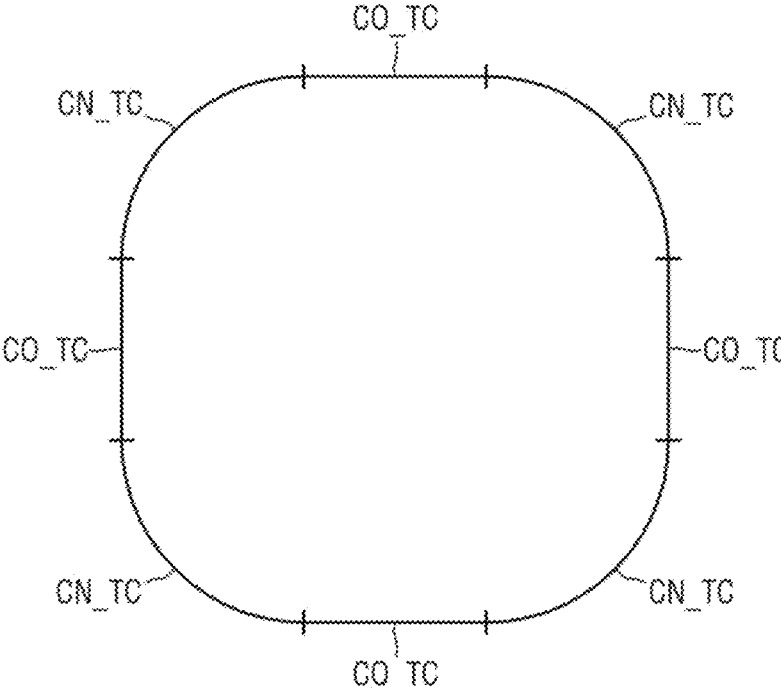

Referring to FIG. 5A, the initial target curve IN_TC and each of the sides of the initial target pattern IN_TP at one point. The initial target curve IN_TC may include a plurality of connecting lines CN_TC.

The connecting lines CN_TC of the initial target curve IN_TC do not meet the initial target pattern IN_TP. Each of the connecting lines CN_TC of the initial target curve IN_TC may connect two points where the initial target curve IN_TC and the initial target pattern IN_TP meet.

Referring to FIG. 5B, at one side of the initial target pattern IN_TP, the initial target curve IN_TC may meet the initial target pattern IN_TP by a line, The initial target curve IN_TC may include a plurality of contact lines CO_TC and a plurality of connecting lines CN_TC.

Each of the contact lines CO_TC of the initial target curve IN_TC meets the initial target pattern IN_TP, Each of the connecting lines CN_TC of the initial target curve IN_TC may connect two contact lines CO_TC of the initial target cure IN_TC.

The initial target curve IN_TC may be as illustrated in FIG. 5A or 5B, depending on the intent of a user.

Referring to FIGS. 1, 6, and 9 through 11, a plurality of bias control points BCP1, BCP2 are generated (S130).

The bias control points BCP1, BCP2 may be generated on the initial target curve IN_TC. The bias control points BCP1, BCP2 may be positioned on the initial target curve IN_TC.

The bias control points BCP1, BCP2 are generated where the initial target pattern IN_TP and the initial target curve IN_TC meet. The bias control points BCP1, BCP2 are even generated where the initial target pattern IN_TP and the initial target curve IN_TC do not meet.

The bias control points BCP1, BCP2 may include first bias control points BCP1 and second bias control points BCP2. The first bias control points BCP1 are generated where the initial target pattern IN_TP and the initial target curve IN_TC, meet. The second bias control points BCP2 are generated where the initial target pattern IN_TP and the initial target curve IN_TC do not meet.

At least one first bias control point BCP1 may be generated at each location where the initial target pattern IN_TP and the initial target curve IN_TC meet. In other words, at least one first bias control point BCP1 may be generated between each pair of adjacent second bias control points BCP2 on the initial target curve IN_TC.

For example, as illustrated in FIG. 5A, in a case where the initial target curve IN_TC and the initial target pattern IN_TP meet at one location, one first bias control point BCP1 may be generated at the location where the initial target curve IN_TC and the initial target pattern IN_TP meet.

In another example, as illustrated in FIG. 5B, in a case where the initial target curve IN_TC and the initial target pattern IN_TP meet along a line, at least one first bias control point BCP1 may be generated along the line where initial target curve IN_TC and the initial target pattern IN_TP meet. That is, at least one first bias control point BCP1 may be generated on each of the contact lines CO_TC of the initial target curve IN_TC.

At least one second bias control point BCP2 may be generated where the initial target curve IN_TC and the initial target pattern IN_TP do not meet. At least one second bias control points BCP2 may be generated on each of the connecting lines CN_TC of the initial target curve IN_TC. In other words, at least one second bias control point BCP2 may be generated between each pair of adjacent first bias control points BCP1 on the initial target curve IN_TC.

Figure 9:
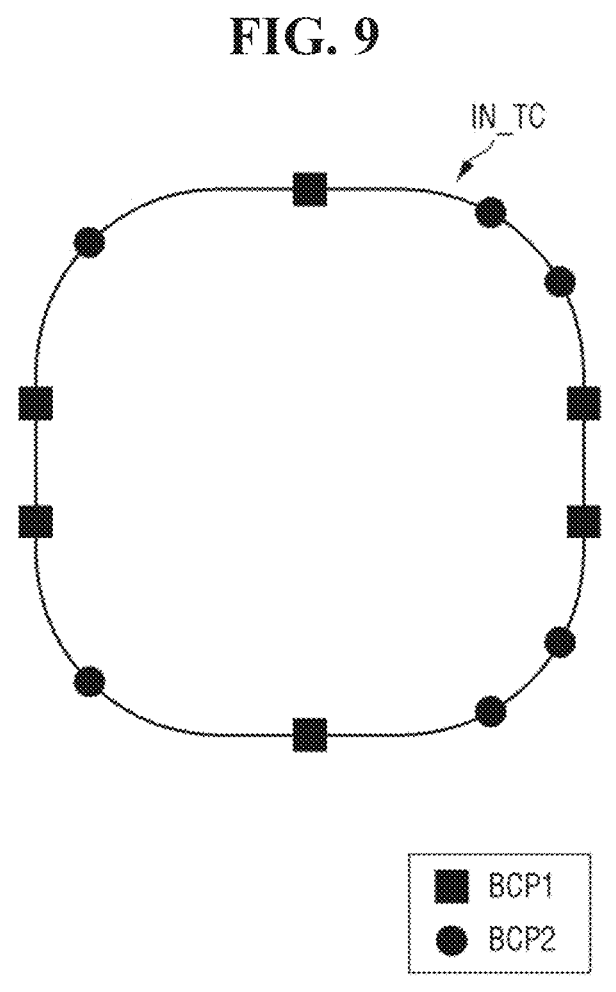

Referring to FIG. 9, the number of first bias control points BCP1 generated on each of the contact lines CO_TC of the initial target curve IN_TC may differ from one contact line CO_TC to another contact line CO_TC of the initial target curve IN_TC. Also, the number of second bias control points BCP2 generated on each of the connecting lines CN_TC of the initial target curve IN_TC may differ from one connecting line CN_TC to another connecting line CN_TC of the initial target curve IN_TC.

Figure 10:
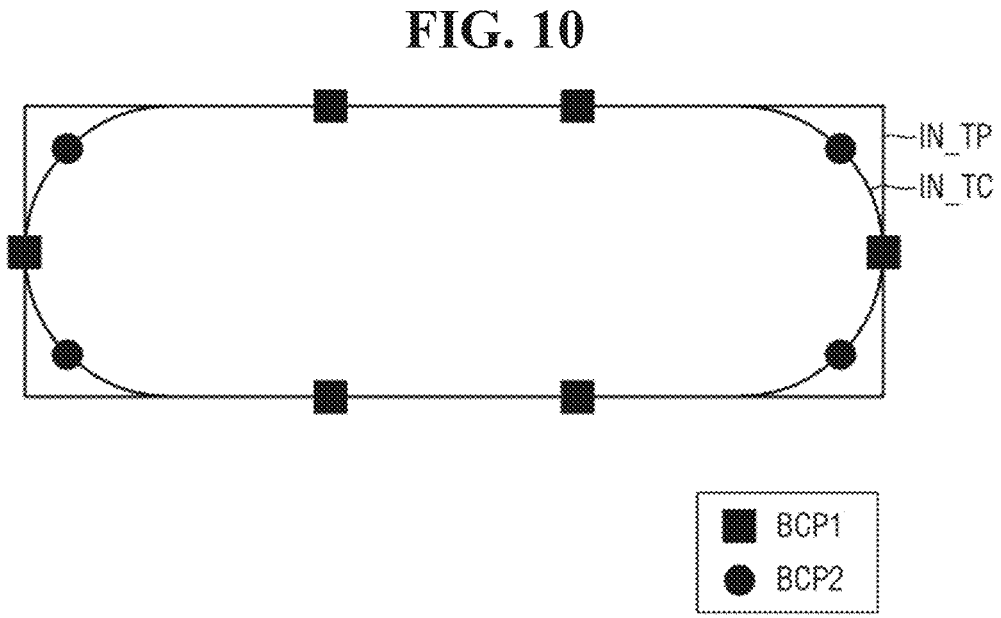

FIG. 10 illustrates an initial target pattern IN_TP having a rod shape extending in one direction. A plurality of bias control points BCP1, BCP2 may be generated on an initial target curve IN_TC that meets the rod-shaped initial target pattern IN_TP.

Figure 11:
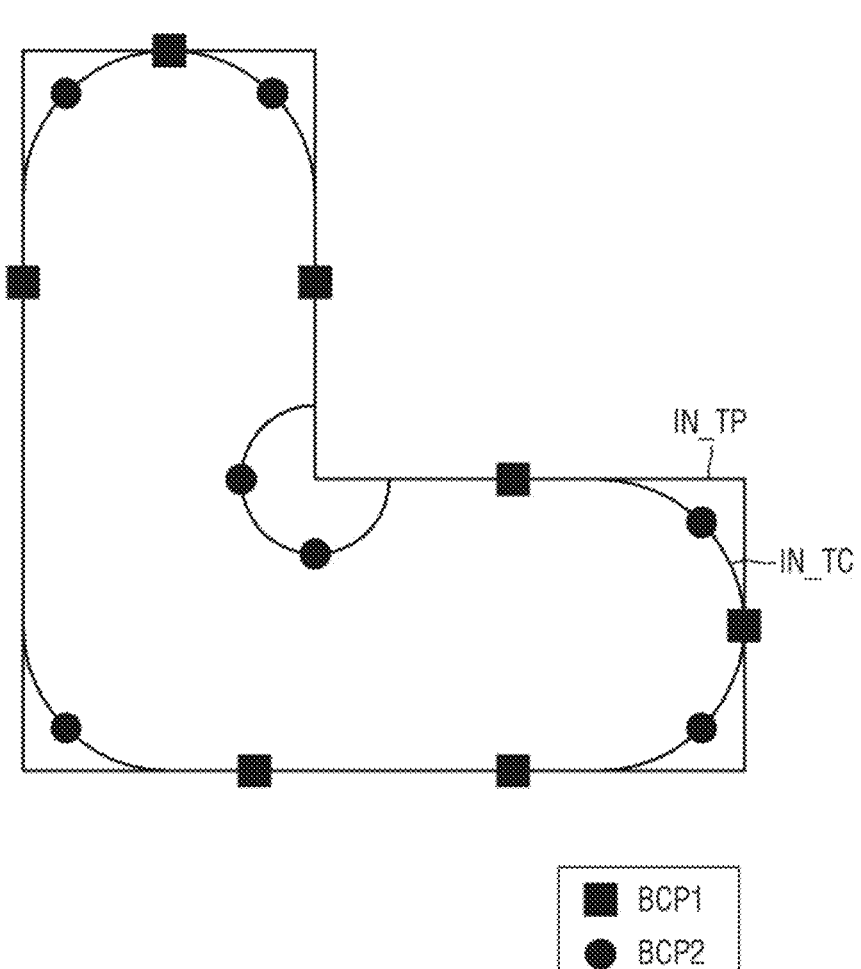
Figure 12:
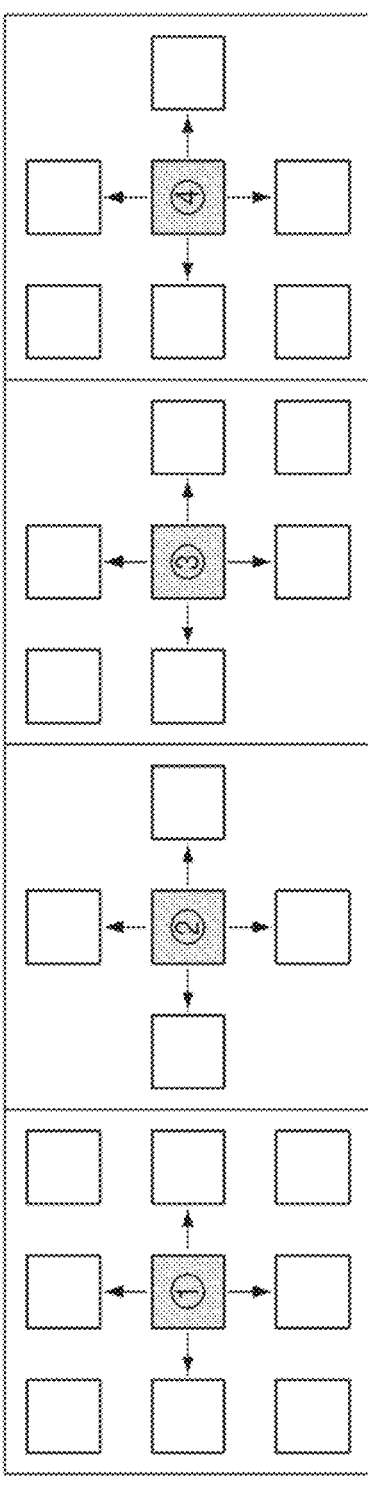

FIG. 11 illustrates an initial target pattern IN_TP having an L shape. A plurality of bias control points BCP1, BCP2 may be generated on an initial target curve IN_TC that meets the L-shaped initial target pattern TN TP, The shape of the initial target curve IN TC and the locations of the bias control points BCP1, BCP2 are not limited to those illustrated in FIGS. 10 and 11, The first bias control points BCP1 are used to bias the initial target curve IN TC in a direction perpendicular to the sides of the initial target pattern IN_TP.

Figure 6:
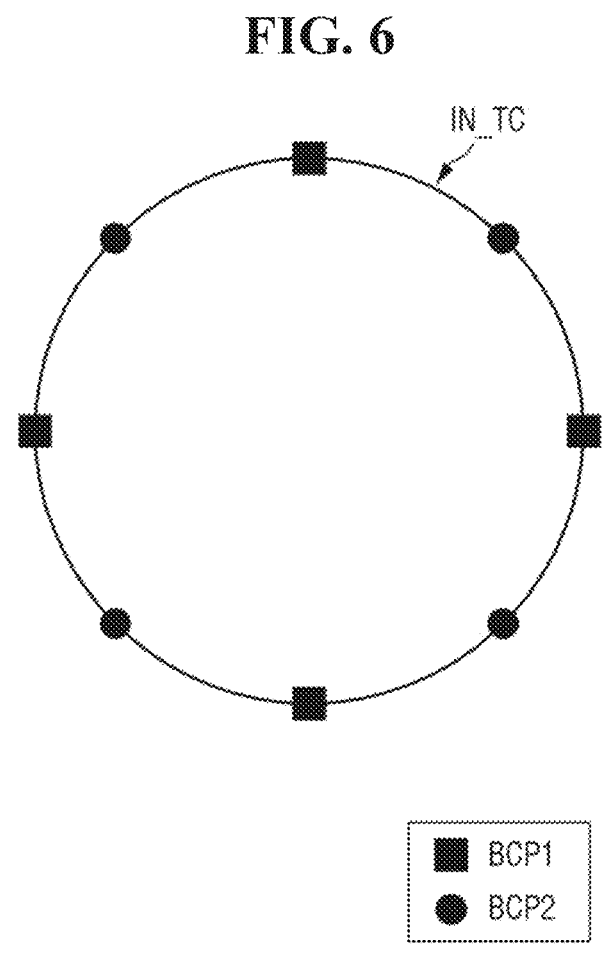

The following description will be described using the initial target curve IN_TC in which the bias control points BCP1, BCP2 are generated as shown in FIG. 6

Figure 7:
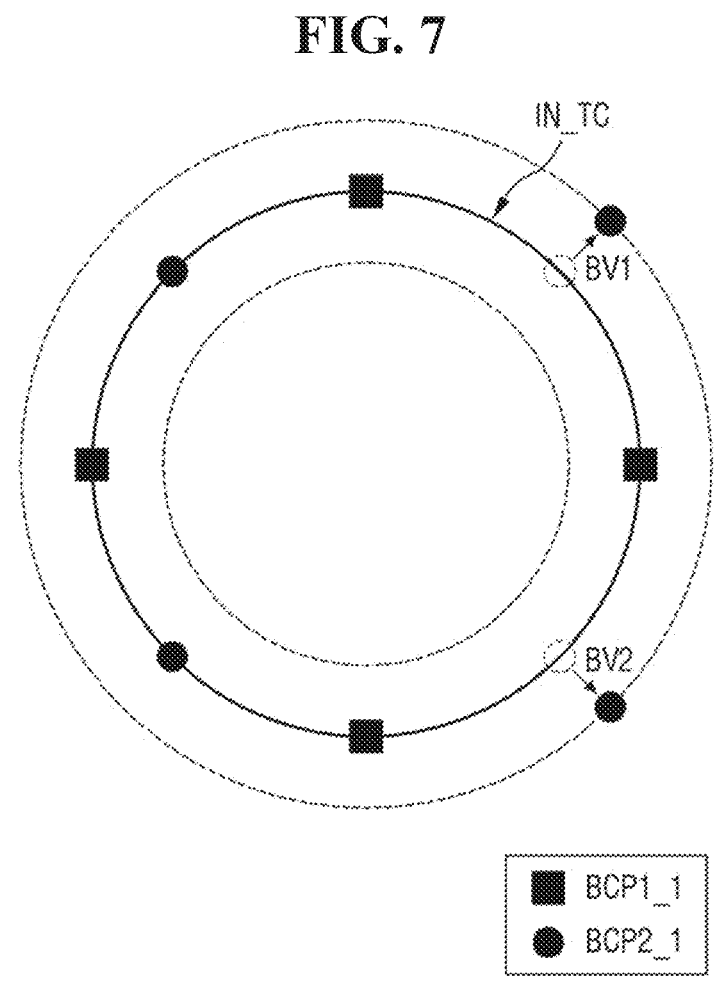

Referring to FIGS. 1, 2, and 7, the bias control points BCP1, BCP2 are biased (S140).

The size to which the bias control points BCP1, BCP2 are biased may be determined in consideration of the layout of the peripheral target patterns P_TP around the interest target pattern I_TP. That is, the size to which the bias control points BCP1, BCP2 are biased may be determined in consideration of the locations of peripheral targets around the initial target pattern IN_TP. Here, the peripheral targets may be associated with the peripheral target patterns P_TP.

For example, first and second bias values BV1 and BV2 may be calculated in consideration of the locations of the peripheral targets around the initial target pattern IN_TP. The first and second bias values BV1 and BV2 may be calculated for all and each of the bias control points BCP1, BCP2 on the initial target curve IN_TC. The first and second bias values BV1 and BV2 may be positive or negative values. The first bias value BV1 may be equal to, or different from, the second bias value BV2.

For example, referring to FIG. 7, in a case where the bias control points BCP1, BCP2 move from the initial target curve IN_TC to a lager dotted line area larger than the initial target curve IN_TC, the bias control points BCP1, BCP2 may be biased with positive values. On the contrary, in a case where the bias control points BCP1, BCP2 move from the initial target curve IN_TC to a smaller dotted line area than the initial target curve IN_TC, the bias control points BCP1, BCP2 may be biased with negative values.

In another example, referring to FIG. 7, in a case where the bias control points BCP1, BCP2 move from the initial target curve IN_TC to the lager dotted line area larger than the initial target curve IN_TC the bias control points BCP1, BCP2 may be biased with negative values. On the contrary, in a case where the bias control points BCP1, BCP2 move from the initial target curve IN_TC to the smaller dotted line area than the initial target curve IN_TC, the bias control points BCP1, BCP2 may be biased with positive values.

Each of the bias control points BCP1, BCP2 may be biased by using the first or second bias value BV1 or BV2. Each of the bias control points BCP1, BCP2 may be biased by as much as the first or second bias value BV1 or BV2. In other words, each of the bias control points BCP1, BCP2 may move by as much as the first or second bias value BV1 or BV2.

Each of the bias control points BCP1, BCP2 may be biased by as much as the first or second bias value BV1 or BV2 so that the bias control points BCP1, BCP2 may be placed at biased bias control points BCP1_1, BCP2_1.

Figure 8:
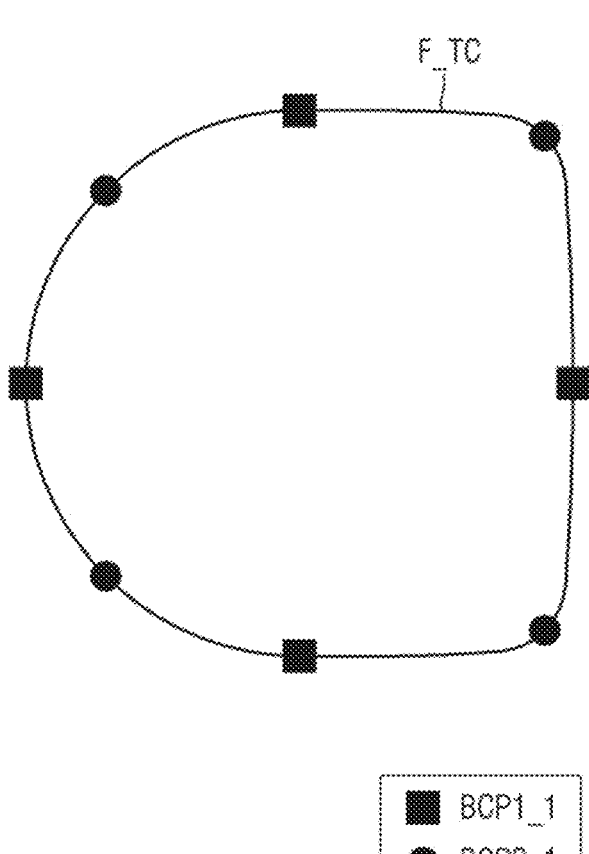

Referring to FIGS. 1 and 8, the biased bias control points BCP1_1, BCP2 _1 are connected (S150).

A final target curve F_TC may be obtained by connecting the biased bias control points BCP1_1, BCP2_1. The final target curve F_TC may be a curve obtained by connecting the biased bias control points BCP1_1, BCP2_1.

It has been described above with reference to FIGS. 1 through 11 how to generate the final target curve F_TC.

The final target curve F_TC may be used to perform OPC during be fabrication of a mask.

FIG. 12 illustrates a case where bias control points are biased only in directions perpendicular to the sides of an initial target pattern. FIG. 13 illustrates a case where bias control points are biased in both directions perpendicular to the sides of an initial target pattern and directions not perpendicular to the sides of the initial target pattern.

Referring to FIGS. 12 and 13, each shaded rectangle may represent the interest target pattern I_TP of FIG. 2, which is used to generate the final target curve F_TC.

As illustrated in FIG. 12 and FIG. 13, peripheral target patterns may be disposed above and below, and on both sides of, an interest target pattern. However, the layout of the peripheral target patterns may all differ from ① to ② to ③ to ④ of FIG. 12 and FIG. 13.

In a case where bias control points are biased only in the directions perpendicular to the sides of the initial target pattern, only the peripheral target patterns above or below, or on either side of, the interest target pattern may affect the biasing of the bias control points.

Even though the layout of the peripheral target patterns around the interest target pattern differs from ① to ② to ③ to ④ of FIG. 12, final target curves for ① through ④ of FIG. 12 may all have the same shape.

However, when implemented as actual patterns on a substrate, peripheral target patterns that are not above or below, or on either side of, the interest target pattern may affect the interest target pattern. That is, defects may occur in the actual patterns on the substrate.

On the contrary, the shapes of the final target curves for ① through ④ of FIG. 13 may be made to differ from one another in consideration that the layout of the peripheral target patterns around the interest target pattern differs from ① to ② to ③ to ④ of FIG. 13.

Specifically, the size to which an initial target curve is biased in directions (as indicated by solid line arrows) where the peripheral target patterns are arranged with respect to the interest target pattern may differ from the size to which the initial target curve is biased in directions where the peripheral target patterns are not arranged with respect to the interest target pattern, as indicated by dotted line arrows. Accordingly, the shapes of the final target curves for ① through ④ of FIG. 13 may all differ from one another.

As the shape of a final target curve varies depending on the layout of peripheral target patterns around an interest target pattern, the occurrence of defects in actual patterns on a substrate can be prevented.

Figure 14:
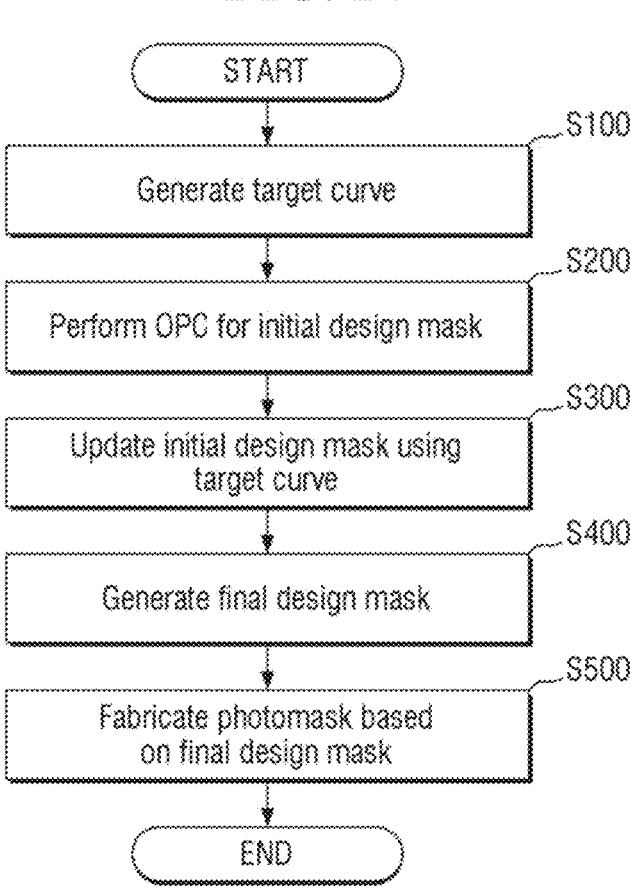
FIG. 14 is a flowchart illustrating a method of fabricating a mask according to some example embodiments of the present disclosure.

FIG. 14 is a flowchart illustrating a method of fabricating a mask according to some example embodiments of the present disclosure. FIGS. 15 through 18 illustrate the method of fabricating a mask according to some example embodiments of the present disclosure.

Referring to FIG. 14, a target curve is generated (S100).

The target curve may correspond to the final target curve described above with reference to FIGS. 1 through 11 (e.g., the final target curve F_TC of FIG. 8). That is, the target curve may be generated based on the bias control points BCP1, BCP2 of FIG. 6.

Figure 15:
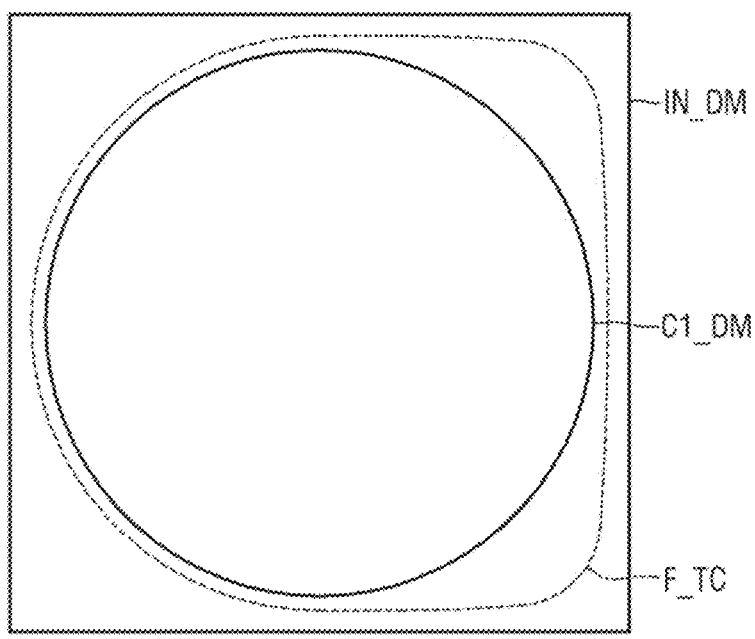

Referring to FIGS. 14 and 15, OPC is performed on an initial design mask IN_DM (S200).

The initial design mask IN_DM may be associated with the initial target pattern IN_TP of FIG. 3.

Specifically, the initial design mask IN_DM is generated. A contour C1_DM of the initial design mask IN_DM is extracted by performing OPC. The contour C1_DM of the initial design mask IN_DM may be extracted through simulation by inputting mask data regarding the initial design mask IN_DM to an OPC model.

Various basic data may be input for OPC. Here, the basic data may include mask data regarding fragments. Also, the basic data may include data such as the thickness, the refractive index, and the dielectric constant of photoresist (PR) and source map data regarding the type of an illumination system. However, the basic data is not particularly limited. The mask data may include not only data regarding fragments, but also the shapes, locations, and types of measurements (e.g., space or line measurements) of patterns.

The contour C1_DM of the initial design mask IN_DM is the result of OPC. The contour C1_DM of the initial design mask IN_DM may correspond to the shape of a pattern formed on a water through exposure using a photomask. That is, the shape of the contour C1_DM of the initial design mask IN_DM may be transferred onto a wafer.

Before an OPC process for extracting the contour C1_DM of the initial design mask IN_DM, a final target curve F_TC is generated.

Figure 16:
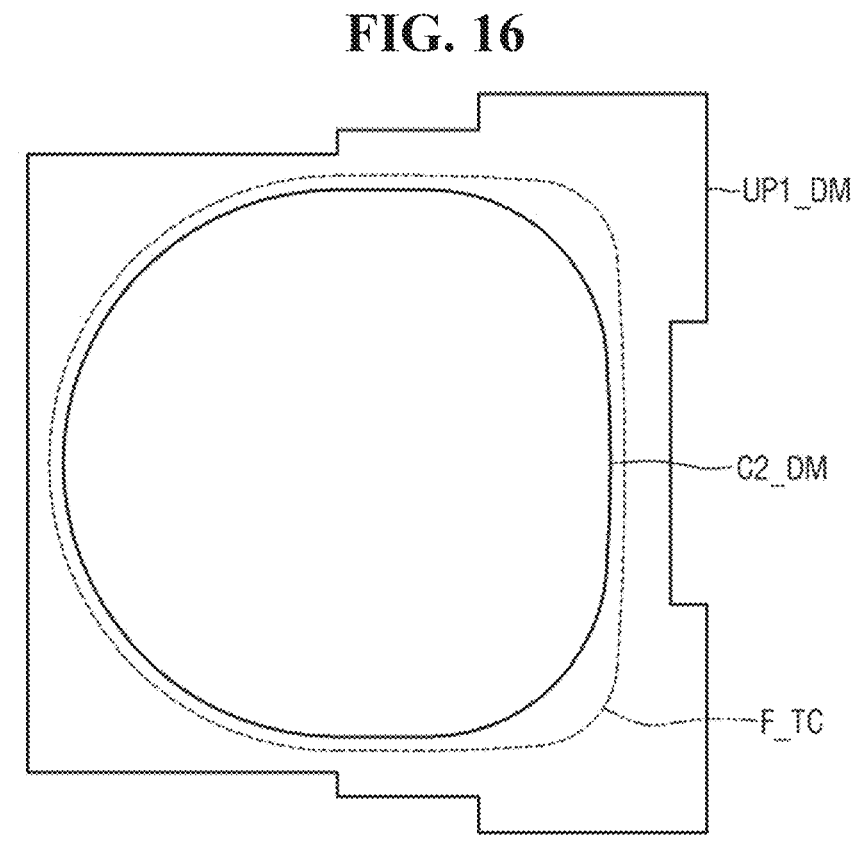

Referring to FIGS. 14 through 16, the initial design mask IN DM is updated using the final target curve F_TC (S300).

A first updated design mask UP1_DM, which is obtained by updating the initial design mask IN_DM, is generated using the final target curve F_TC and the contour C1_DM of the initial design mask IN_DM.

A first difference between the final target curve F_TC and the contour C1_DM of the initial design mask IN_DM is calculated. The mask data of the initial design mask IN_DM may be updated with the use of the first difference. As a result, the first updated design mask UP1_DM may be generated.

Referring to FIG. 16, a contour C2_DM of the first updated design mask UP1_DM is extracted by performing OPC on the first updated design mask UP1_DM.

A second updated design mask UP2_DM is generated by updating the first updated design mask UP1_DM with the use of the final target curve F_TC and the contour C2_DM of the first updated design mask UP1_DM.

OPC for extracting the contour of a design mask may be repeatedly performed. Then, the design mask may be repeatedly updated by calculating the contour obtained by OPC and the final target curve F_TC.

Figure 17:
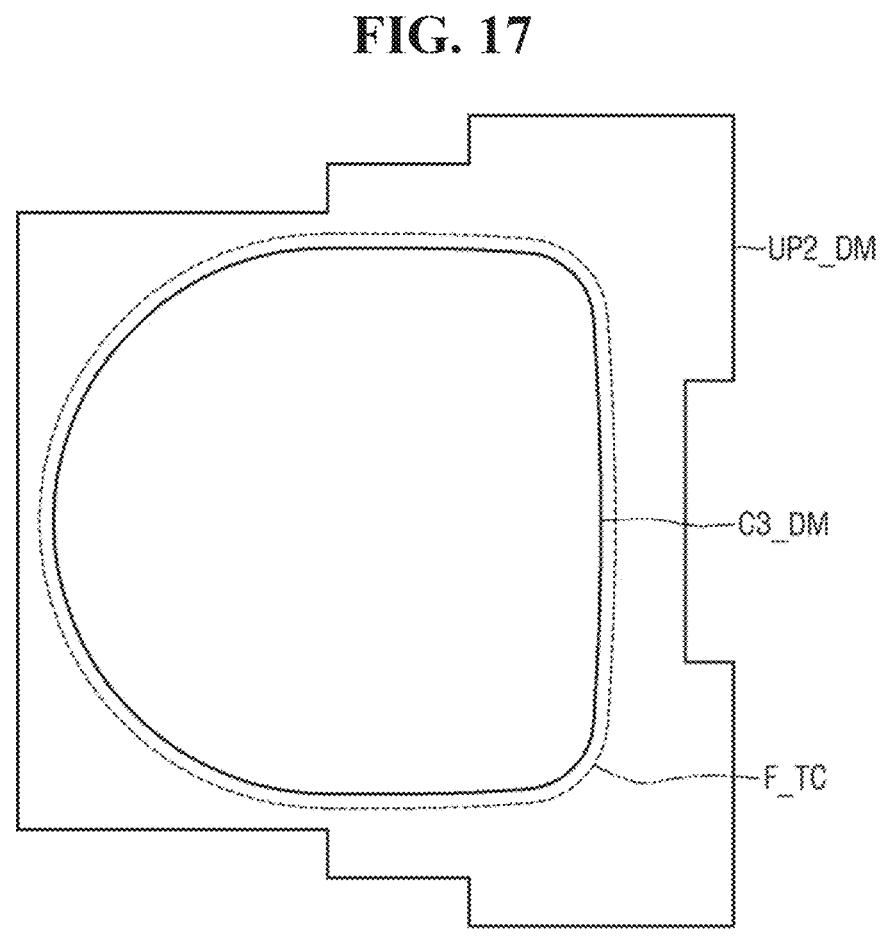
Figure 18:
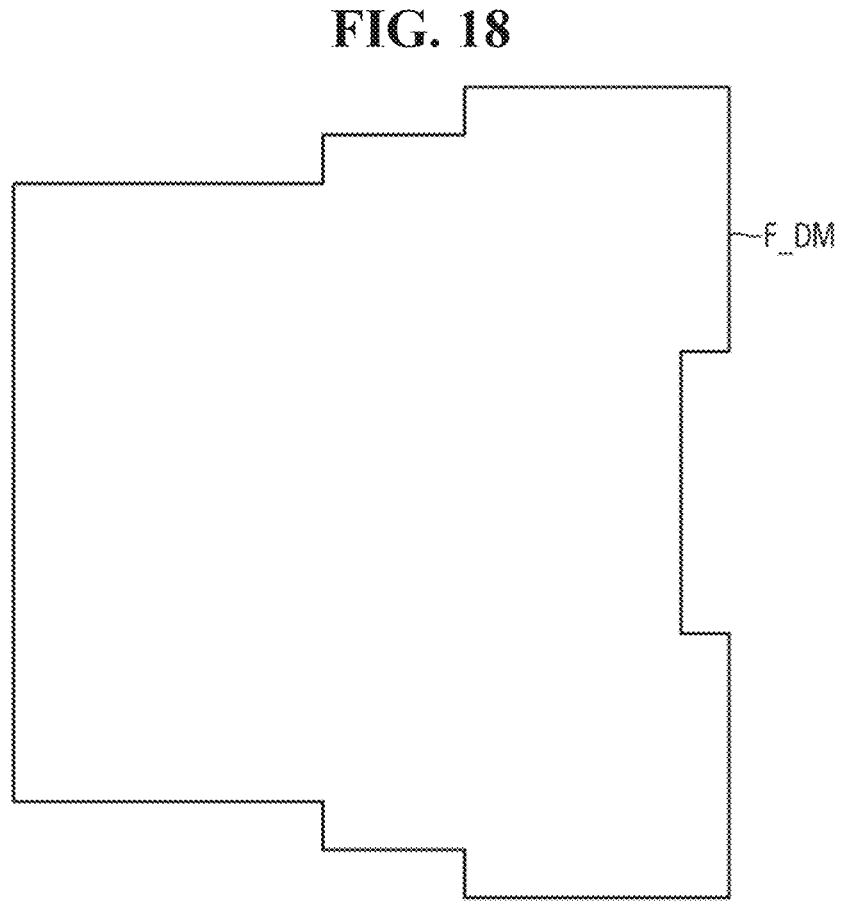

For convenience, it is assumed that the second updated design mask UP2_DM is a final design mask F_DM, however, in some example embodiments, additional updated design masks may be generated Referring to FIGS. 14, 17, and 18, the final design mask F_DM is generated (S400).

The final design mask F_DM may be generated by repeatedly performing OPC.

For example, a contour C3_DM of the second updated design mask UP2_DM is extracted by performing OPC. The second updated design mask UP2_DM may be the final design mask DM if the difference between the final target curve F_TC and the contour C3_DM of the second updated design mask UP2_DM is less than a reference value.

In another example, the user may determine the number of OPC processes to be performed during the fabrication of a mask in advance. If the number of OPC processes that have been performed is the reference value, a mask obtained by the last OPC process may be the final design mask F_DM. If the reference value is 3, the second updated design mask UP2_DM may be the final design mask F_DM.

Referring to FIGS. 14 and 18 photomask is fabricated based on the final design mask F_DM (S500).

Figure 22:
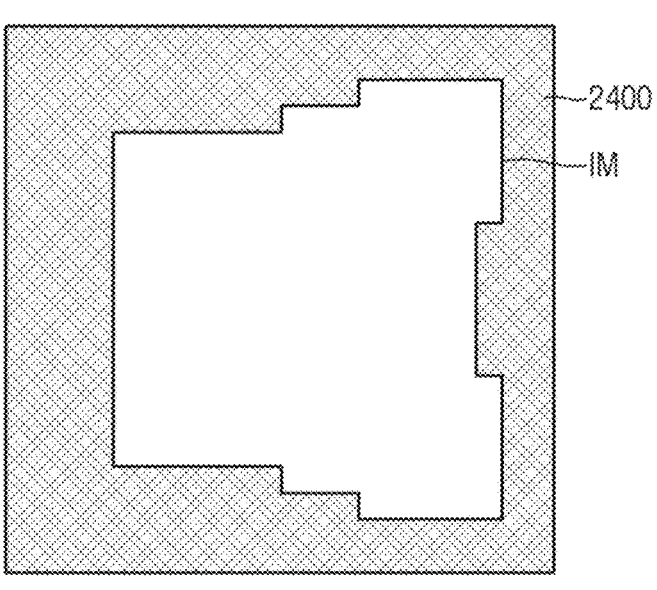
FIG. 22 illustrates an exemplary photomask included in to photolithography system of FIGS. 21.

The photomask may be as illustrated in FIG. 22.

Figure 19:
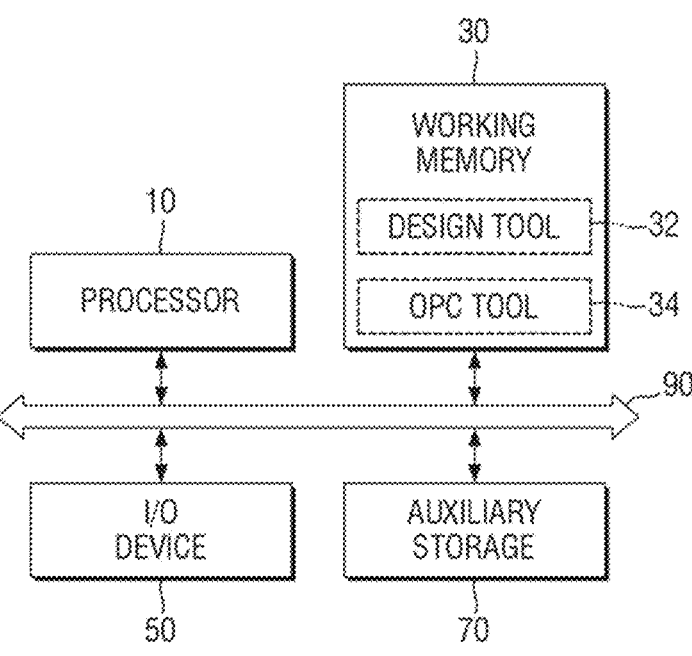
FIG. 19 is a block diagram of an apparatus for fabricating a mask according to some example embodiments of the present disclosure.

FIG. 19 is a block diagram of an apparatus for fabricating a mask according to some example embodiments of the present disclosure.

Referring to FIG. 19, the apparatus may include a processor 10, a working memory 30, an input/output (I/O) device 50, an auxiliary storage device 70, and a system interconnector 90.

For example, the apparatus may be an apparatus dedicated for the method of fabricating a mask according to some example embodiments of the present disclosure or may be an apparatus dedicated for conducting semiconductor design, including an apparatus dedicated for the method of fabricating a mask according to some example embodiments of the present disclosure. For example, the apparatus may include various design and design simulation programs.

The processor 10 may execute software (e.g., application programs, an operating system (OS), and device drivers) to be run in the apparatus. Although not specifically illustrated, the processor 10 may execute an OS loaded in the working memory 30. The processor 10 may execute various application programs to be run on the OS. For example, the processor 10 may be a central processing unit (CPU), a microprocessor, an application processor (AP), or an arbitrary processing device similar to an AP.

The OS and the application programs may be loaded in the working memory 30. Although not specifically illustrated, an OS image may be loaded into the working memory 30 in accordance with a booting sequence during the booting of the apparatus. I/O operations for the apparatus may be supported by the OS. Similarly, the application programs may be loaded into the working memory 30 to provide basic services or services selected by the user. A design tool 32 for semiconductor design and/or an OPC tool 34 for generating a target curve and fabricating a mask may be loaded from the auxiliary storage device 70 into the working memory 30.

The design tool 32 may be equipped with a bias function for changing the shapes and locations of particular layout patterns differently from a design rule. Also, the design tool 32 may perform design rule check (DRC) under changed bias data conditions. For example, the working memory 30 may be a volatile memory such as a dynamic random-access memory (DRAM) or a static random-access memory (SRAM) or may be a nonvolatile memory (non-transitory memory) such as a flash memory, a phase-change random-access memory (PRAM), a resistive random-access memory (RRAM), a nano-floating gate memory (NFGM), a polymer random-access memory (PoRAM), a magnetic random-access memory (MRAM), or a ferroelectric random-access memory (FRAM).

The I/O device 50 may control user input and output from user interface devices. For example. the 1/0 device 50 may be equipped with input means such as a keyboard, a keypad, a mouse, or a touchscreen and may thus be able to receive information from the user. The user may receive information regarding semiconductor areas or data paths that require the calibration of operating characteristics, via the I/O device 50. Also, the I/O device 50 may be equipped with output means such as a printer or a display and may thus be able to display how the design tool 32 and/or the OPC tool 34 are being processed and the results thereof.

The auxiliary storage device 70 may be provided as a storage medium for the apparatus. The auxiliary storage device 70 may store the application programs, the OS image, and various data. The auxiliary storage device 70 may be provided as a mass storage device such as a memory card (e.g., an MMC, an eMMC, an SD, or a MicroSD), a hard disk drive (HDD), a solid-state drive (SSD), or a universal flash storage (UFS).

The system interconnector 90 may be a system bus for providing a network inside the apparatus. The processor 10, the working memory 30, the I/O device 50, and the auxiliary storage device 70 may be electrically connected via the system interconnector 90 and may thus be able to exchange data with one another. However, the present disclosure is not limited to this, and various other mediation means than the system interconnector 90 may be further provided for efficiency.

Figure 20:
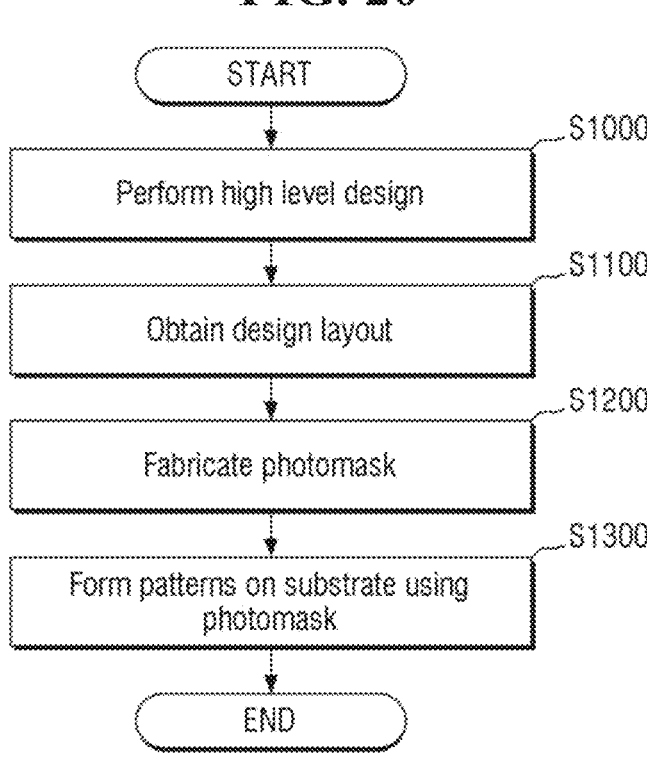
FIG. 20 is a flowchart illustrating a method of fabricating a semiconductor device according to some example embodiments of the present disclosure.

FIG. 20 is a flowchart illustrating a method of fabricating a semiconductor device according to some example embodiments of the present disclosure.

Referring to FIG. 20, a high-level design process for a semiconductor device is performed (S1000).

The high-level design process may refer to describing a target integrated circuit (IC) in a high-level computer language such as, for example, C programming language. Circuits designed by the high-level design process may be expressed in further detail by register transfer level (RTL) coding or simulation. Code generated by RTL coding may be converted into a netlist to be synthesized into an entire semiconductor device. Synthesized schematic circuits are verified by a simulation tool and ay be calibrated depending on the result of the verification.

The design layout of layers included in the semiconductor device is obtained (S1100), In other words, a layout design process may be performed to implement a logically completed semiconductor device on a silicon substrate. For example, the layout design process may be performed based on a schematic circuit prepared by the high-level design process or a netlist corresponding to the schematic circuit, The layout design process may include a routing operation of placing and connecting various standard cells provided by a cell library, in accordance with a predetermined (or, alternatively, desired) design rule, The cell library for the layout design process may include information on operations, speeds and power consumption of the standard cells. A cell library for representing the layout of a circuit having a specific gate level may be defined in most layout design tools.

Here, the term "layout" may refer to a procedure for defining the shapes or sizes of patterns for configuring transistors and metal wiring, which are to be actually formed on a silicon substrate. For example, layout patterns, such as P-type metal-oxide semiconductor (PMOS) transistors, N-type metal-oxide semiconductor (NMOS) transistors, N-well region, gate electrodes, and metal wiring to be arranged thereon, may be placed to form an inverter circuit on a silicon substrate. To this end, an appropriate inverter may be searched for and selected from inverters defined in advance in the cell library.

A routing operation may be performed on selected and placed standard cells. Specifically, upper wiring may be routed on the selected and placed standard cells. As a result of the routing operation, standard cells may be connected to one another to fit the design. S1000 and S1100 may be performed automatically or manually by the design tool 32 of FIG. 19. The placement and routing of standard cells may be performed automatically via a separate placement and routing tool.

After the routing operation, a verification operation may be performed on the layout to verify whether the layout violates the design rule. The verification operation may include DRC for verifying whether the layout conforms to the design rule, electrical rule check (ERC) for verifying whether there are any electrical disconnections in the layout, and Layout Vs Schematic (LVS) check for verifying whether the layout coincides with a gate-level netlist.

Thereafter, a photomask is fabricated (S1200). S1200 may be performed by the method of fabricating a mask according to some example embodiments of the present disclosure, described above with reference to FIGS. 1 through 18.

OPC is performed on the design layout, thereby obtaining an updated design layout. The updated design layout may include a final design mask such as the final design mask F DM of FIG. 18.

A photomask is prepared based on the updated design layout. Generally, a photomask may be fabricated by patterning layout patterns on a chromium (Cr) film deposited on a glass substrate, but the present disclosure is not limited thereto.

Thereafter, patterns may be formed on the substrate by using the photomask (S1300). In this manner, a semiconductor device may be fabricated.

Various exposure and etching processes may be repeatedly performed during the fabrication of the semiconductor device with the use of the photomask. As a result, the shapes of patterns obtained by the layout design process may be sequentially formed on a silicon substrate.

Figure 21:
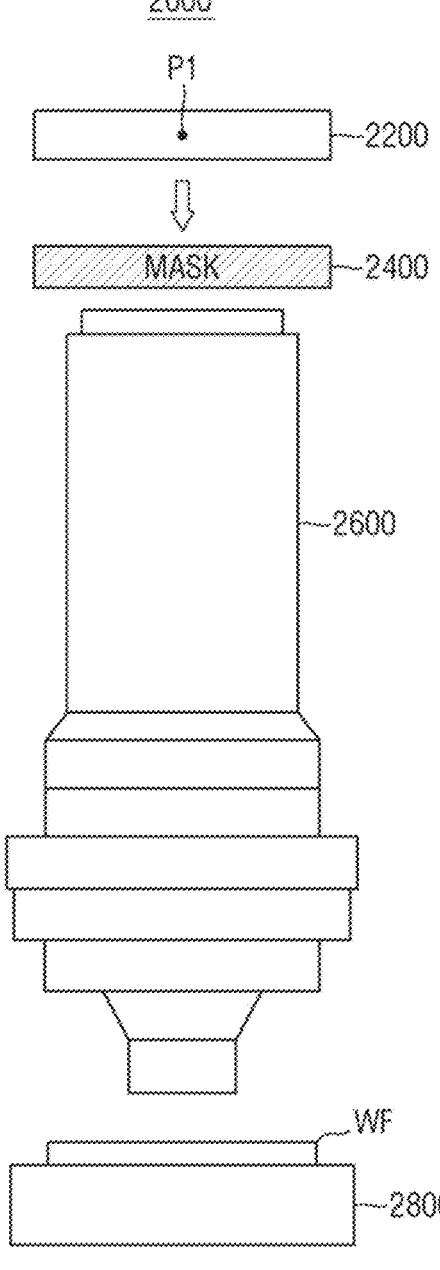
FIG. 21 is a block diagram of a photolithography system that performs the method of fabricating a semiconductor device according to some example embodiments of the present disclosure.

FIG. 21 is a block diagram of a photolithography system that performs the method of fabricating a semiconductor device according to some example embodiments of the present disclosure.

Referring to FIG. 21, a photolithography system 200( )may include a light source 2200, a photomask 2400, a reduction projection apparatus 2600, and a substrate stage 2800.

The photolithography system 2000 may further include elements that are not illustrated in FIG. 21. For example, the photolithography system 2000 may further include a sensor for use in measuring the height and the slope of the surface of a substrate The light source 2200 may emit light. Light emitted from the light source 2200 may be applied to the photomask 2400. For example, a lens may be provided between the light source 2200 and the photomask 2400 to control the focus of light. The light source 2200 may include an ultraviolet (UV) light source (e.g., a krypton fluoride (KrF) light source having a wavelength of about 234 nm or an argon fluoride (ArF) light source having a wavelength of about 193 nm). The light source 2200 may include a single point light source P1, but the present disclosure is not limited thereto. In some example embodiments, the light source 2200 may include a plurality of point light sources.

The photomask PM may include image patterns to print (or realize) a designed layout onto the substrate WF. For example, the image patterns may be formed as transparent areas and opaque areas. The transparent areas may be formed by etching a metal layer (e.g., a Cr film) on the photomask 2400. The transparent areas may transmit therethrough light emitted from the light source 2200. On the contrary, the opaque areas may block the transmission of light.

The reduction projection apparatus 2600 may receive light transmitted through the photomask 2400. The reduction projection apparatus 2600 may match the image patterns of the photomask 2400 and layout patterns to be printed onto the substrate WF. The substrate stage 2800 may support the substrate WF. For example, the substrate WF may include a silicon wafer.

The reduction projection apparatus 2600 may include an aperture, The aperture may be used to increase the depth of the focus of light emitted from the light source LS. For example, the aperture may include a dipole aperture or a quadruple aperture. The reduction projection apparatus 2600 may further include a lens for adjusting the focus of light.

The transparent areas included in the image patterns of the photomask 2400 may transmit therethrough light emitted from the light source 2200. The light transmitted through the photomask 2400 may be applied onto the substrate WF through the reduction projection apparatus 2600. As a result, patterns corresponding to the image patterns of the photomask 2400 may be printed on the substrate WF.

Meanwhile, as the integration density of a semiconductor device increases, the distance between the image patterns of the photomask 2400 and the width of the transparent areas included in the image patterns of the photomask 2400 considerably decrease. Due to the proximity of the image patterns of the photomask 2400 to one another, the interference and diffraction of light are highly likely to occur, and a different layout from a desired layout may be printed on the substrate WF. in this case, a designed circuit may operate abnormally.

To prevent or reduce the distortion of the desired layout, resolution enhancement technology may be used. According to an OPC method, which is a type of resolution enhancement technology, the degree of distortion such as the interference and diffraction of light may be estimated in advance. Also, the image patterns of the photomask 2400 may be biased in advance based on the result of the estimation, Accordingly, the desired layout can be printed on the substrate WF.

OPC may be performed to adjust a layout for a single layer. However, a semiconductor device may be configured to include a plurality of layers For example, a semiconductor device may include a plurality of metal layers that are stacked to realize a particular circuit. Thus, OPC may be performed independently on each of a plurality of layers of a semiconductor device.

Obviously, in a case where an extreme UV (EUV) light source is used as the light source 2200, the configuration of the photolithography system 2000 may vary.

Figure 23:
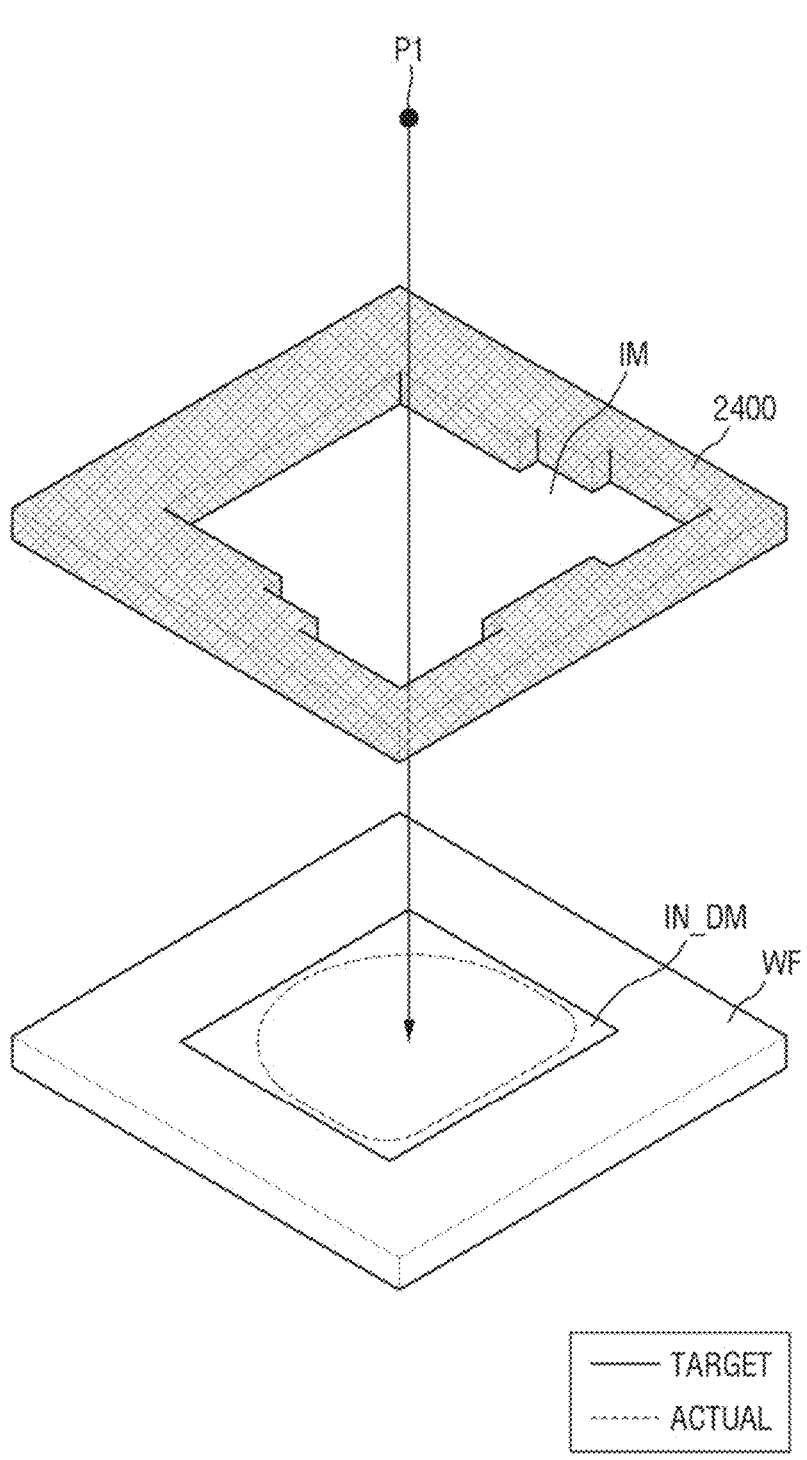
FIG. 23 illustrates how to print a circuit pattern on a substrate with the use of the photomask of FIG. 22.

FIG. 22 illustrates an exemplary photomask included in the photolithography system of FIG. 21. FIG. 23 illustrates how to print a circuit pattern on a substrate with the use of the photomask of FIG. 22.

Referring to FIG. 22, a photomask 2400 may include an image pattern IM corresponding to the final design mask F_DM of FIG. 18. The photomask 2400 may include a transparent area and an opaque area. The opaque area may block the transmission of light. On the contrary, the transparent area may transmit therethrough light emitted from the light source 2200 of FIG. 21. Light transmitted through the photomask 2400 may be applied onto the substrate WF of FIG. 21. The image pattern IM may form the transparent area.

Referring to FIG. 23, a point light source P1 of the light source 2200 of FIG. 21 may emit light toward the photomask 2400.

The emitted light may be applied to the substrate WF through the transparent area of the image pattern IM. As a result, an initial design mask IN_DM corresponding to the image pattern IM may be printed on the substrate WF.

In a case where the photomask 2400 includes the image pattern IM, an actual layout "ACTUAL" printed on the substrate WF may be substantially the same as (or has only a small error from) a target layout "TARGET". The actual layout "ACTUAL" may be similar to the final target curve F_TC described above with reference to FIGS. 14 through 17.

In conclusion, OPC may be performed to fabricate the photomask 2400, which includes a biased image pattern IM, and minimize the error between the actual layout "ACTUAL" and the target layout "TARGET". As a result, a similar shape to the final target curve F_TC of FIG. 8, which is obtained by the method of generating a target curve according to some example embodiments of the present disclosure, can be printed on the substrate WF.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The processor 10 (or other circuitry, for example, the working memory 30, i/o device 50, auxiliary storage 70, or other circuitry discussed herein) may include hardware including logic circuits; a hardware/software combination such as a processor executing software; or a combination thereof. For example, the processing circuitry more specifically may include, but is not limited to, a central processing unit (CPU) , an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the example embodiments without substantially departing from the principles of the present inventive concepts. Therefore, the disclosed example embodiments of the inventive concepts are used in a genetic and descriptive sense only and not for purposes of limitation.

What is claimed:

1. A method of fabricating a mask, comprising:
generating bias control points based on an initial target pattern and an initial target curve;
generating a target curve by using the bias control points;
extracting a first contour of an initial design mask by performing an optical proximity correction (OPC) process;
generating a first updated design mask based on updating the initial design mask, using the first contour and the target curve;
calculating a difference between the target curve and the first contour;
extracting a second contour of the first updated design mask by performing the OPC process; and
generating a second updated design mask by using the second contour and the target curve.

2. The method of claim 1, wherein the target curve is generated before performing the OPC process for extracting the first contour.

3. The method of claim 1, wherein the generating the target curve includes:
generating the initial target pattern,
generating the initial target curve that meets the initial target pattern, and
generating the bias control points on the initial target curve.

4. The method of claim 3, wherein the initial target pattern is a polygon having n sides.

5. The method of claim 3, wherein
the bias control points include a first bias control point and a second bias control point,
the first bias control point is generated where the initial target pattern and the initial target curve meet, and
the second bias control point is generated where the initial target pattern and the initial target curve do not meet.

6. The method of claim 5, wherein
the initial target curve includes a contact line that meets the initial target pattern, and
at least one first bias control point is generated on the contact line.

7. The method of claim 5, wherein
the initial target curve includes a connecting line that does not meet the initial target pattern, and
at least one second bias control point is generated on the connecting line.

8. The method of claim 3, further comprising:
biasing the bias control points; and
connecting the biased bias control points.

9. The method of claim 8, wherein the biasing the bias control points includes:
calculating a bias value in consideration of locations of peripheral targets around the initial target pattern, and
biasing the bias control points by using the bias value.

10. The method of claim 1, further comprising:
generating a final design mask based on a number of times the OPC process has been performed reaching a reference value.

11. The method of claim 1, further comprising:
extracting a third contour of the second updated design mask by performing the OPC process; and

generating a final design mask if a difference between the third contour and the target curve is less than a reference value.

12. A method of fabricating a mask, comprising:
generating an initial target curve;
generating a plurality of bias control points on the initial target curve;
generating a target curve by using the bias control points;
extracting a first contour of an initial design mask by performing an optical proximity correction (OPC) process after the generating the target curve;
generating a first updated design mask based on updating the initial design mask, using the first contour and the target curve;
calculating a difference between the target curve and the first contour; and
generating a final design mask by repeatedly performing the OPC process.

13. The method of claim 12, further comprising:
generating an initial target pattern before the generating the initial target curve,
wherein
the initial target pattern is a polygon having n sides, and
the initial target curve meets the initial target pattern on each of the n sides of the initial target pattern.

14. The method of claim 13, wherein
the plurality of bias control points include a first bias control point and a second bias control point,
the first bias control point is generated where the initial target pattern and the initial target curve meet, and
the second bias control point is generated where the initial target patterns and the initial target curve do not meet.

15. The method of claim 12, wherein the generating the target curve, includes biasing each of the bias control points in consideration of locations of peripheral targets around an initial target pattern.

16. The method of claim 15, wherein the target curve is generated by connecting the biased bias control points.

17. A method of fabricating a semiconductor device, comprising:
fabricating a mask; and
forming patterns on a substrate by using the mask,
wherein the fabricating the mask, includes:
generating an initial target pattern,
generating an initial target curve that meets the initial target pattern,
generating bias control points on the initial target curve,
generating a target curve by using the bias control points,
extracting a first contour of an initial design mask by performing an optical proximity correction (OPC) process after the generating the target curve,
generating a first updated design mask based on updating the initial design mask, using the first contour and the target curve,
calculating a difference between the target curve and the first contour;
extracting a second contour of the first updated design mask by performing the OPC process, and
generating a second updated design mask by using the second contour and the target curve.

18. The method of claim 17, wherein
the bias control points include a first bias control point and a second bias control point,
the first bias control point is generated where the initial target pattern and the initial target curve meet, and

the second bias control point is generated where the initial
target patterns and the initial target curve do not meet.

19. The method of claim 18, wherein at least one second
bias control point is generated between each pair of adjacent
first bias control points on the initial target curve.

20. The method of claim 17, wherein the generating the
target curve includes:

biasing the bias control points in consideration of loca-
tions of peripheral targets around the initial target
pattern, and connecting the biased bias control points.

* * * * *